United States Patent  
Arai

(10) Patent No.: US 11,417,382 B2
(45) Date of Patent: Aug. 16, 2022

(54) APPARATUSES AND METHODS FOR SKIPPING WORDLINE ACTIVATION OF DEFECTIVE MEMORY DURING REFRESH OPERATIONS

(71) Applicant: MICRON TECHNOLOGY, INC., Boise, ID (US)

(72) Inventor: Minari Arai, Niiza (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/125,051

(22) Filed: Dec. 17, 2020

(65) Prior Publication Data

US 2022/0199141 A1 Jun. 23, 2022

(51) Int. Cl.
*G11C 11/406* (2006.01)
*G11C 11/408* (2006.01)

(52) U.S. Cl.
CPC ........ *G11C 11/406* (2013.01); *G11C 11/4082* (2013.01); *G11C 11/4085* (2013.01); *G11C 11/4087* (2013.01)

(58) Field of Classification Search
CPC .............. G11C 11/406; G11C 11/4082; G11C 11/4085; G11C 11/4087
See application file for complete search history.

(56) References Cited

U.S. PATENT DOCUMENTS

| 5,670,993 | A | 9/1997 | Greene et al. |
| 6,005,823 | A | 12/1999 | Martin et al. |
| 6,438,055 | B1 | 8/2002 | Taguchi et al. |
| 9,373,422 | B1* | 6/2016 | Kwean ................. G11C 29/808 |
| 10,381,064 | B1 | 8/2019 | Morohashi |
| 10,490,250 | B1* | 11/2019 | Ito .......................... G11C 29/76 |
| 10,910,034 | B2 | 2/2021 | Morohashi |
| 11,152,078 | B1* | 10/2021 | Du ........................ G11C 11/406 |
| 2003/0043672 | A1 | 3/2003 | Inoue et al. |
| 2003/0086311 | A1 | 5/2003 | Benedix et al. |
| 2006/0198207 | A1 | 9/2006 | Ishikawa |
| 2009/0213671 | A1 | 8/2009 | Koo |
| 2011/0194367 | A1 | 8/2011 | Wong et al. |
| 2019/0228814 | A1 | 7/2019 | Morohashi |
| 2019/0362775 | A1* | 11/2019 | Morohashi ............. G11C 29/76 |

OTHER PUBLICATIONS

U.S. Appl. No. 17/005,579, titled "Apparatuses and Methods for Refreshing Memories With Redundancy" filed Aug. 28, 2020.
U.S. Appl. No. 17/305,878 titled "Apparatuses and Methods for Refresh Address Masking" filed Jul. 16, 2021.

* cited by examiner

*Primary Examiner* — Mushfique Siddique
(74) *Attorney, Agent, or Firm* — Dorsey & Whitney LLP

(57) ABSTRACT

Apparatuses and methods for refreshing memory of a semiconductor device are described. An example method includes during a refresh operation, determining a respective row of a memory cells slated for refresh in each of a plurality of sections of a memory bank of a memory device, and determining whether the respective row of memory cells slated for refresh for a particular section of the plurality of sections of the memory bank has been repaired. The example method further includes in response to a determination that the row of memory cells slated for refresh has been repaired, cause a refresh within the particular section of the memory bank to be skipped while contemporaneously performing a refresh of the rows of memory cells slated for refresh in other sections of the plurality of sections of the memory bank to be refreshed.

18 Claims, 6 Drawing Sheets

APPARATUSES AND METHODS FOR SKIPPING WORDLINE ACTIVATION OF DEFECTIVE MEMORY DURING REFRESH OPERATIONS

BACKGROUND

Dynamic random access memory (DRAM) include volatile memory cells that may be used to store data. However, in order to maintain the stored data, the memory cells are periodically refreshed to restore the data being stored. The memory cells are typically refreshed by sequencing through groups of memory cells associated with respective refresh addresses. The refresh address may be generated internally, and the refresh operations for the memory cells corresponding to the refresh address performed in response to refresh commands. In some examples, refreshing defective memory cells can cause unpredictable behavior. Therefore, it may be desirable to mitigate the unpredictable behavior associated with defective memory cells.

DETAILED DESCRIPTION

This disclosure describes examples of skipping wordline activation for defective memory rows during refresh operations involving a contemporaneous refresh of multiple sections of a memory bank. That is, a memory bank may be divided into multiple sections capable of contemporaneous wordline activation. During some refresh operations, a row of memory cells from two or more sections of a memory bank may be refreshed at the same time via contemporaneous activation of corresponding wordlines. A counter may be used to systematically step through each row over time such that the same row in each section is refreshed (e.g., start with first row in each section, followed by a refresh of the second row in each section, etc.). However, in some examples, as the refresh counter increments through rows of each section, it may land on a defective row in one or more particular sections, and cause a refresh of the defective row. Refreshing a defective row can cause issues with subsequent access operations, as the defective row may respond to the wordline activation in an unpredictable manner. For example, when a wordline for a defective row is activated for a refresh operation, and then deactivated after the refresh operation, the row may discharge more slowly than non-defective rows, such that the charged wordline bleeds into subsequent access operations. Thus, to mitigate the unpredictable behavior, the refresh control logic may detect the defective wordline, and cause activation of the wordline corresponding to the defective row to be skipped during the refresh operation.

In some examples, detection of the defective row of memory cells may be performed during the refresh operation just prior to activation of the wordline. In other examples where a refresh operation includes a row hammer refresh (RHR) followed by an automatic refresh (e.g., double-pump refresh), the defective wordline may be detected during the RHR operation. By skipping a refresh on a defective row of memory cells, unpredictable behavior for subsequent access operations may be mitigated.

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the examples of the disclosure. Additionally, terms such as "couples" and "coupled" mean that two components may be directly or indirectly electrically coupled. Indirectly coupled may imply that two components are coupled through one or more intermediate components.

Figure 1:
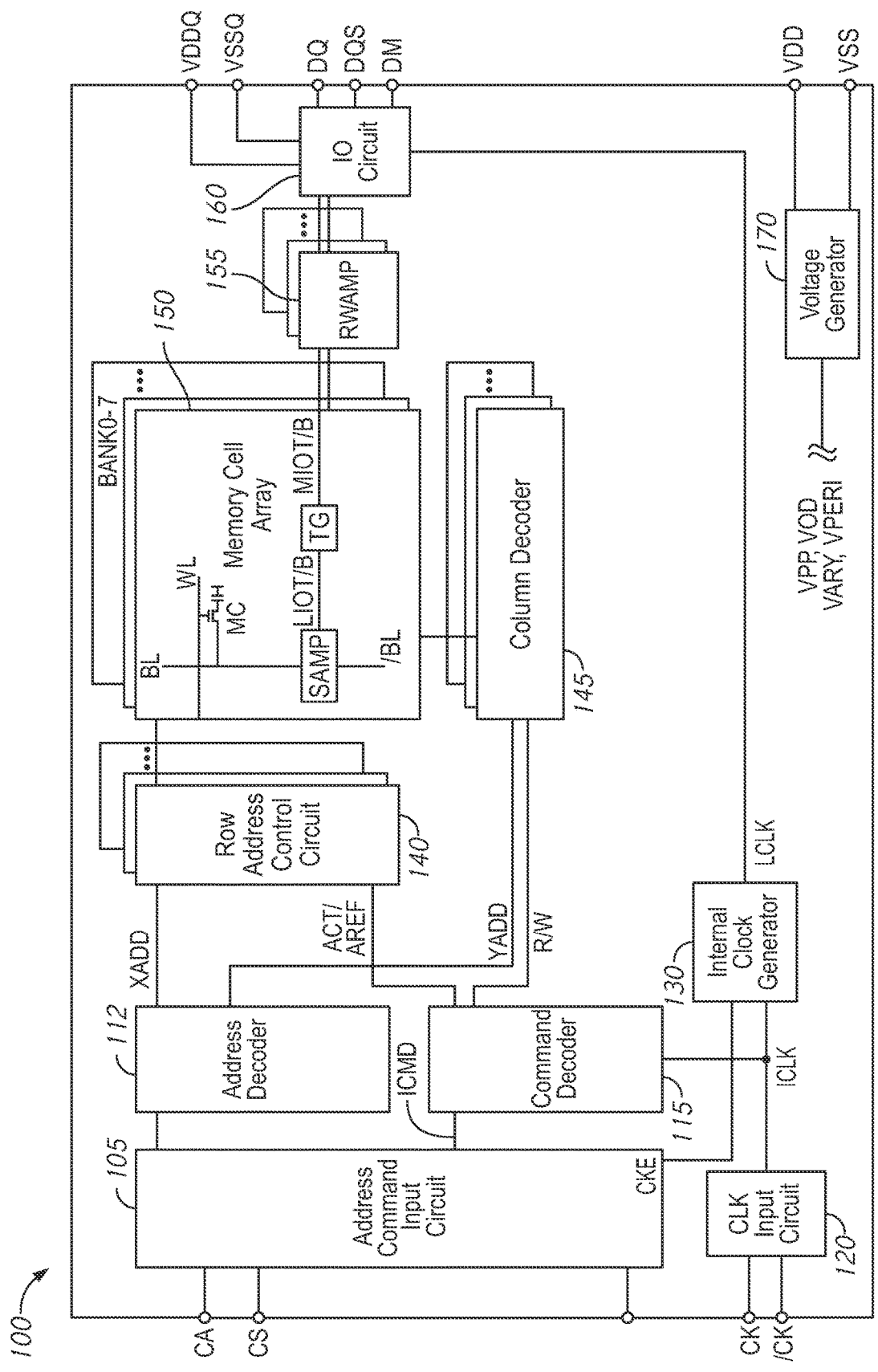
FIG. 1 is a block diagram of an apparatus according to an embodiment of the disclosure.

FIG. 1 is a block diagram of an apparatus according to an embodiment of the disclosure. The apparatus may include a semiconductor device 100, and will be referred as such. In some embodiments, the semiconductor device 100 may include, without limitation, a DRAM device, such as a double data rate (DDR) memory or a low power DDR (LPDDR) memory integrated into a single semiconductor chip, for example. The semiconductor device 100 includes a memory array 150. The memory array 150 includes a plurality of banks, each bank including a plurality of word lines WL, a plurality of bit lines BL and /BL, and a plurality of memory cells MC arranged at intersections of the plurality of word lines WL and the plurality of bit lines BL. The memory cells MC are volatile memory cells, requiring periodic refreshing in order to maintain the data stored in the memory array.

The selection of the word line WL is performed by a row address control circuit 140 and the selection of the bit line BL is performed by a column decoder 145. Sense amplifiers (SAMP) are located for their corresponding bit lines BL and/BL coupled to at least one respective local I/O line pair (LIOT/B), which is in turn coupled to at least one respective main I/O line pair (MIOT/B), via transfer gates (TG), which function as switches.

The memory array 150 may be divided into memory banks BANK0-7, with each memory bank having a regular array and a redundant array. The regular array includes memory cells that are typically used to store data with the memory cells corresponding to respective memory addresses. The redundant array includes memory cells that may be used to "repair" defective memory cells of the regular array. The memory cells may be configured as redundant rows of memory and redundant columns of memory. The redundant rows of memory may be used to repair rows of memory of the regular array, and the redundant columns of memory may be used to repair columns of memory of the regular array. The redundant memory are used to repair defective memory cells of the regular array by having the memory addresses corresponding to the defect memory cells mapped to memory cells of the redundant array. As a result, when the memory address for the defective memory location is provided to the semiconductor device 100, the memory location in the redundant array to which the memory address is mapped is accessed instead of the defective memory location in the regular array corresponding to that memory address.

The semiconductor device 100 may employ a plurality of external terminals, which include command/address terminals CA that are coupled to a command and address bus to receive commands and addresses. The plurality of external terminals further includes clock terminals CK and CK/ to receive clock signals, data terminals DQ and data mask terminals DM, and power supply terminals VDD, VSS, VDDQ, and VSSQ.

The command/address terminals CA may be supplied with memory addresses, for example, from a memory controller. The memory addresses supplied to the command/address terminals CA are transferred, via a command/address input circuit 105, to an address decoder 112. The address decoder 112 receives the memory addresses and supplies decoded row addresses XADD to the row address control circuit 140, and supplies decoded column addresses YADD to the column decoder 145.

The command/address terminals CA may further be supplied with commands from, for example, a memory controller. The commands may be provided as internal command signals ICMD to a command decoder 115 via the command/address input circuit 105. The command decoder 115 includes circuits to decode the internal commands ICMD to generate internal commands and signals for performing operations. For example, the command decoder 115 may provide activation commands ACT and refresh commands AREF to the row address control circuit 140 to select a word line and may provide read/write commands R/W to the column decoder 145 to select a bit line. Refresh commands AREF may be provided by the command decoder 115 to the row control circuit 140 when a refresh operation is to be performed. The refresh command AREF may represent auto refresh commands that result from the semiconductor device 100 receiving a refresh command, and may also represent self-refresh commands, which are generated internally when the semiconductor device 100 is set in a self-refresh mode.

When a read command is received and a memory address is timely supplied with the read command, read data is read from a memory cell in the memory array 150 designated by the memory address. The read data is output to outside from the data terminals DQ via read/write amplifiers 155 and the input/output circuit 160. When a write command is received and a memory address is timely supplied with the write command, write data and a data mask (when applicable) are supplied to the data terminals DQ and DM, and the write data is written to a memory cell in the memory array 150 designated by the memory address. The write data is received by data receivers in the input/output circuit 160, and supplied via the input/output circuit 160 and the read/write amplifiers 155 to the memory array 150.

During the access operations for read and write commands, the row address control circuit 140 may include circuits for determining whether a memory address has been mapped to memory locations in the redundant array, for example, when a memory address corresponding to a defective memory location in the regular array has been mapped to memory locations of the redundant array (e.g., a redundant row of memory). The memory addresses that have been remapped are stored, and memory addresses associated with access operations are compared with the stored memory addresses. The memory addresses that have been mapped to redundant memory may be stored in nonvolatile storage. An example of a nonvolatile storage are fuse circuits (as well as antifuse circuits) that are programmed with the memory addresses to be stored. When a memory address associated with an access operation matches a stored memory address, memory locations in the redundant array are accessed instead of the memory locations in the regular array.

As previously described, the volatile memory cells are periodically refreshed in order to maintain the data stored by the memory array. The memory cells are typically refreshed as rows of memory cells. The row address control circuit 140 may include a refresh control circuit that is used during refresh operations. Refresh operations are performed when active refresh commands AREF are provided to the row address control circuit 140. Each refresh command AREF results in memory locations associated with a refresh address to be refreshed. In some embodiments of the disclosure, the refresh address may be generated internally in the semiconductor device 100. Similar circuits and operation may be included in the column decoder 145 in some embodiments of the disclosure.

A refresh address may have several memory locations associated with it. For example, multiple rows of memory may be associated with a refresh address, with each of the rows of memory corresponding to a value that when combined with the refresh address identifies the particular row of memory. For example, a memory bank of the memory banks BANK0-7 may be divided into multiple sections capable of contemporaneous wordline activation. During some refresh operations, a row of memory cells from two or more sections of a memory bank may be refreshed at the same time via contemporaneous activation of corresponding wordlines. Such an arrangement may facilitate faster access and refresh operations.

When refreshing the memory, the refresh addresses are determined whether to be mapped to redundant memory locations in the redundant array. The determination may be performed during the refresh operation associated with the defective row. In some examples, the refresh operation may be performed immediately prior to activation of a set of wordlines corresponding to the refresh addresses. In double pump refresh operation (e.g., RHR followed by an automatic refresh), the determination may take place during the RHR portion of the refresh operation. In cases where a refresh address has been mapped to redundant memory, the memory locations in the regular array corresponding to the refresh address are not refreshed, thereby avoiding unpredictable behavior associated with necessary refresh operations to memory locations that are not used, for example, when the regular memory locations are defective and the corresponding memory address has been mapped to redundant memory locations. Skipping refresh operations for memory locations that are not used may avoid unpredictable behavior, such as interference with activation of a wordline in that the section including the defective row of memory cells caused by a slow discharge of the activated wordline. Skipping such a refresh may also reduce power consumption compared to performing refresh operations to all memory locations, regardless of their use.

Turning to an explanation of the external terminals included in the semiconductor device 100, the clock terminals CK and /CK are supplied with complementary external clock signals. The external clock signals may be supplied to a clock input circuit 120. The clock input circuit 120 may generate internal clock signals ICLK. The internal clock signals ICLK are supplied to internal clock generator circuit 130 and to the command decoder 115. When enabled by clock enable CKE from the command/address input circuit 105, circuits of the internal clock generator circuit 130 provide various internal clock signals LCLK based on the internal clock signals ICLK. The internal clock signals LCLK may be used for timing the operation of various internal circuits. For example, the LCLK signals may be provided to the input/output circuit 160 for timing the operation of the input/output circuit 160 to provide and receive data on the data terminals DQ.

The power supply terminals VDD and VSS are supplied with power supply potentials. These power supply potentials are supplied to an internal voltage generator circuit 170. The internal voltage generator circuit 170 generates various internal potentials VPP, VOD, VARY, VPERI, and the like based on the power supply potentials provided to the power supply terminals VDD and VSS. The internal potential VPP is mainly used in the row address control circuit 140, the internal potentials VOD and VARY are mainly used in the sense amplifiers SAMP included in the memory array 150, and the internal potential VPERI is used in many other peripheral circuit blocks.

The power supply terminals VDDQ and VSSQ are also supplied with power supply potentials. The power supply potentials are supplied to the input/output circuit 160. The power supply potentials provided to the power supply terminals VDDQ and VSSQ may be the same potentials as the power supply potentials provided to the power supply terminals VDD and VSS in some embodiments of the disclosure. Dedicated power supply potentials are provided to the power supply terminals VDDQ and VSSQ so that power supply noise generated by the input/output circuit 160 does not propagate to the other circuit blocks.

Figure 2:
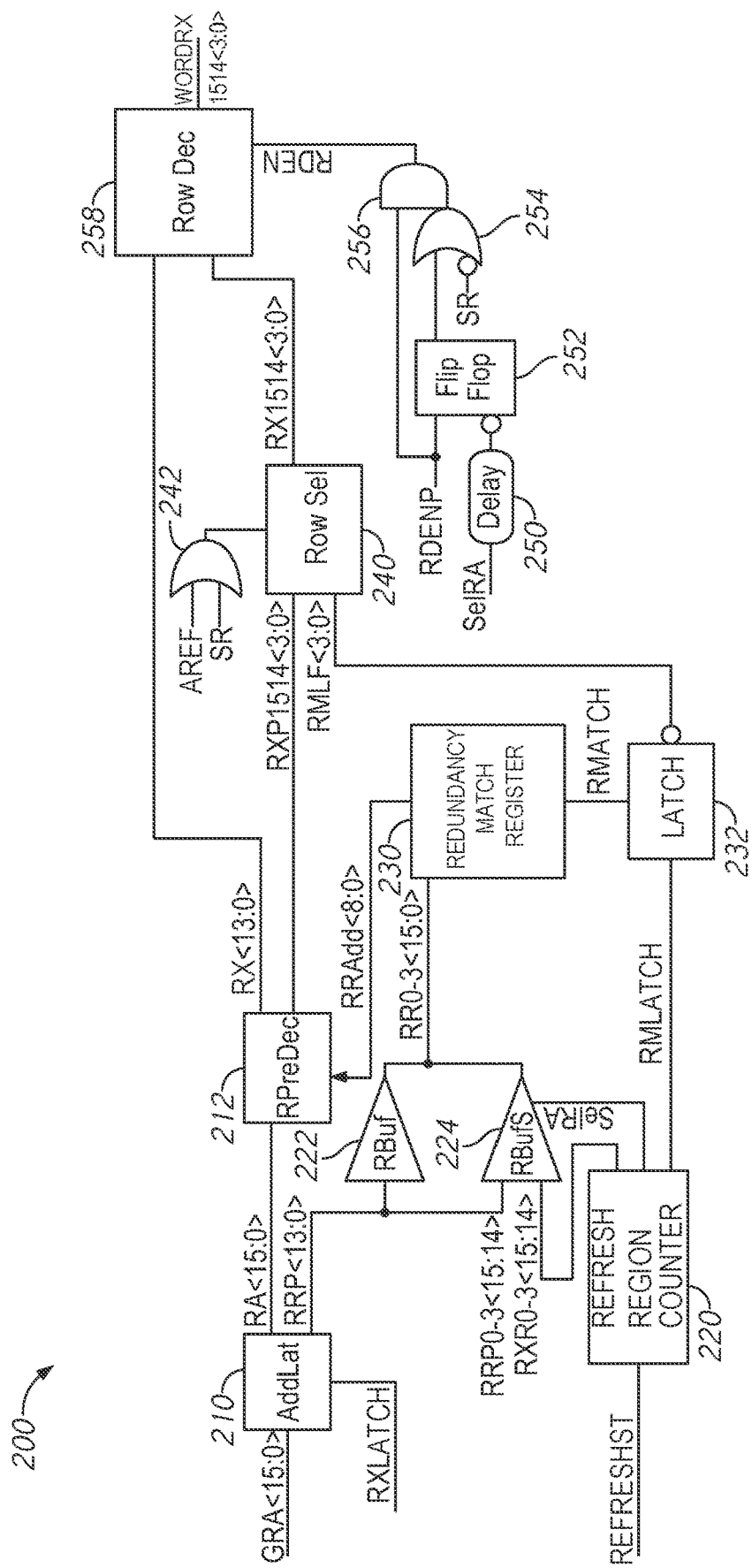
FIG. 2 is an exemplary block diagram of a row address control circuit according to an embodiment of the disclosure.

FIG. 2 is an exemplary block diagram of a row address control circuit 200 according to an embodiment of the disclosure. The row address control circuit 140 of FIG. 1 may implement the row address control circuit 200, in some embodiments. The row address control circuit 200 may include an address latch 210, a pre-decoder 212, a refresh region counter circuit 220, a buffer circuit 222, a buffer circuit 224, a redundancy match register 230, a latch 232, a row selector 240, a OR gate 242, a delay circuit 250, a flip-flop 252, a OR gate 254, a AND gate 256, and a row decoder 258.

The address latch 210 may be configured to receive a global row address GRA<15:0> and responsive to a row address latch signal RXLATCH, may be configured to latch the row address RA<15:0> for provision to the pre-decoder 212 and to latch the redundancy row addresses RRP0-3<15:0> for provision to the buffer circuit 222 and the buffer circuit 224.

The refresh region counter circuit 220 may be configured to provide refresh addresses RX0-3<15:14> and a select refresh address SelRA signal to the buffer circuit 224 based on a refresh signal REFRESHST. The REFRESHST signal may be set in response to a refresh command (e.g., from a command decoder, such as the command decoder 115 of FIG. 1). In some examples, the REFRESHST signal may be set based on an AREF command (e.g., the AREF command of FIG. 1), or a self-refresh command. The refresh region counter circuit 220 may include a two-bit counter that is configured to provide each count value (e.g., b00, b01, b10, and b11) as a respective one of the RX0-3<15:14> addresses.

Collectively, the buffer circuit 222 and the buffer circuit 224 may provide the RR0-3<15:0> addresses to the redundancy match register 230. The buffer circuit 222 may provide RRP<13:0> bits as the RR<13:0> bits. The buffer circuit 224 may selectively provide one of the RRP0-3<15:14> addresses or the RXR0-3<15:14> addresses to as the RR0-3<15:14> addresses based on the SelRA signal. During a normal access operation, the buffer circuit 222 and the buffer circuit 224 may provide the RRP0-3<15:0> addressees to the redundancy match register 230 (e.g., based on the SelRA signal indicating a non-refresh operation). During a refresh operation, the buffer circuit 222 may be configured to provide the RRP<13:0> bits and the buffer circuit 224 may be configured to provide the RX0-3<15:14> addresses from the refresh region counter circuit 220 to collectively make up the RR0-3<15:0> addresses (e.g., based on the SelRA signal indicating a refresh operation).

The pre-decoder 212 may decode the RA<15:0> address to provide pre-decoded row addresses (e.g., RXP0-3<15:14> address bits each combined with the RX<13:0> address bits). The pre-decoder 212 may also receive a redundancy row address RRAdd<8:0> from the redundancy match register 230, which may be used to replace some or all of the decoded RA<15:0> with a replacement row (e.g., during normal access operations).

The redundancy match register 230 may compare the RR0-3<15:0> addresses with addresses stored at the redundancy match register 230 to determine whether any of the the RR0-3<15:0> addresses have been replaced with a redundant address. In response to a determination that a particular one of the RR0-3<15:0> addresses has been replaced with a redundant address, the redundancy match signals RMATCH may be set. Further in response to the determination that the particular one of the the RR0-3<15:0> addresses has been replaced with a redundant address, the redundancy match register 230 may also provide the redundancy row address RRAdd<8:0> to the pre-decoder 212. The latch 232 may latch the particular RMATCH signal for a corresponding one of active low redundancy match latch signals RMLF<3:0> to indicate a match. During a refresh operation, the refresh region counter circuit 220 may set the RMLATCH signal to cause each bit of the RMLF<3:0> signals indicating a match for a corresponding one of the RXR0-3<15:14> signals. For example, RMLF<0> signal may indicate whether an address corresponding to the RXR0<15:14> address has been replaced with a redundant address, the RMLF1<1> signal may indicate whether an address corresponding to the RXR1<15:14> has been replaced with a redundant address, etc. Each of the RMLF<3:0> signals may correspond to a particular section of a memory bank.

The OR gate 242 may receive an AREF signal and a self-refresh SR signal, and in response to either being set (e.g., indicating a refresh operation), may cause the row selector 240 to selectively provide the RMLF<3:0> signals as the RX1514<3:0> signals. For non-refresh access operations (e.g., when neither of the AREF or SR signals are set, the row selector 240 may provide the RXP1514<3:0> signals as the RX1514<3:0> signals. The provided RX1514<3:0> signals be decoded by the row decoder 258 to determine whether to perform or skip an access operation on a particular section of a corresponding memory bank.

The delay circuit (e.g., the delay circuit 250, the flip-flop 252, the OR gate 254, and the AND gate 256) may be configured to provide a row decoder enable signal RDEN to the row decoder 258 to initiate decoding of the provided RX1514<3:0> signals and the RX<13:0> address to activate wordlines associated with wordline addresses WORDRX1514<3:0>. Because the redundancy check on the refresh addresses through the refresh region counter circuit 220, the buffer circuit 224, the redundancy match register 230, the latch 232, and the row selector 240 takes some amount of time after the REFRESHST signal is set and the GRA<15:0> address is latched by the address latch 210, the delay circuit 250, the flip-flop 252, and the OR gate 254 may delay the RDEN signal from being set to enable the row decoder 258 in order to allow those components to make a determination as to whether any of the particular rows have been replaced with a redundant row.

In operation, a refresh operation may be contemporaneously performed on a plurality of rows of a memory bank. To avoid activation of a wordline on a defective memory row, the row address control circuit 200 may be configured to determine whether any of the plurality of rows have been replaced with a redundant row (e.g., via the redundancy match register 230), and if so, may prevent activation of that row (e.g., via the row selector 240).

At the start of a refresh operation, the address latch 210 may receive a GRA<15:0> address, and responsive to the RXLATCH signal, may latch the RA<15:0> address for provision to the pre-decoder 212 and may latch the RRP<15:0> addresses for provision to the buffer circuit 222 and the buffer circuit 224. The refresh region counter circuit 220 may be configured to provide the RXR0-3<15:14> addresses and the SelRA signal to the buffer circuit 224 in response to the REFRESHST signal. Once the REFRESHST signal is set, the refresh region counter circuit 220 may provide the RXR0-3<15:14> addresses and the SelRA signal. The RX0-3<15:14> addresses may collectively represent each two-bit count value (e.g., b00, b01, b10, and b11).

The buffer circuit 222 and the buffer circuit 224 may provide the RR0-3<15:0> addresses to the redundancy match register 230, with the buffer circuit 224 selectively providing one of the RRP0-3<15:14> addresses or the RXR0-3<15:14> addresses to as the RR0-3<15:0> addresses based on the SelRA signal. During a normal access operation, the buffer circuit 222 and the buffer circuit 224 may provide the RRP0-3<15:0> addressees to the redundancy match register 230 (e.g., based on the SelRA signal indicating a non-refresh operation). During a refresh operation, the buffer circuit 222 may be configured to provide the RRP<13:0> bits and the buffer circuit 224 may be configured to provide the RX0-3<15:14> addresses from the refresh region counter circuit 220 to collectively make up the RR0-3<15:0> addresses (e.g., based on the SelRA signal indicating a refresh operation).

The pre-decoder 212 may decode the RA<15:0> address to provide pre-decoded row addresses (e.g., RXP0-3<15:14> address bits each combined with the RX<13:0> address bits). The pre-decoder 212 may also receive a redundancy row address RRAdd<8:0> from the redundancy match register 230, which may be used to replace some or all of the decoded RA<15:0> with a replacement row (e.g., during normal access operations).

The redundancy match register 230 may compare the RR0-3<15:0> addresses with redundancy-replaced addresses stored at the redundancy match register 230 to determine whether the RR0-3<15:0> addresses has been replaced with a redundant address. In response to a determination that the RR0-3<15:0> address has been replaced with a redundant address, the redundancy match signals RMATCH may be set. Further in response to the determination that the particular one of the RR0-3<15:0> addresses has been replaced with a redundant address, the redundancy match register 230 may also provide the redundancy row address RRAdd<8:0> to the pre-decoder 212.

Figure 3:
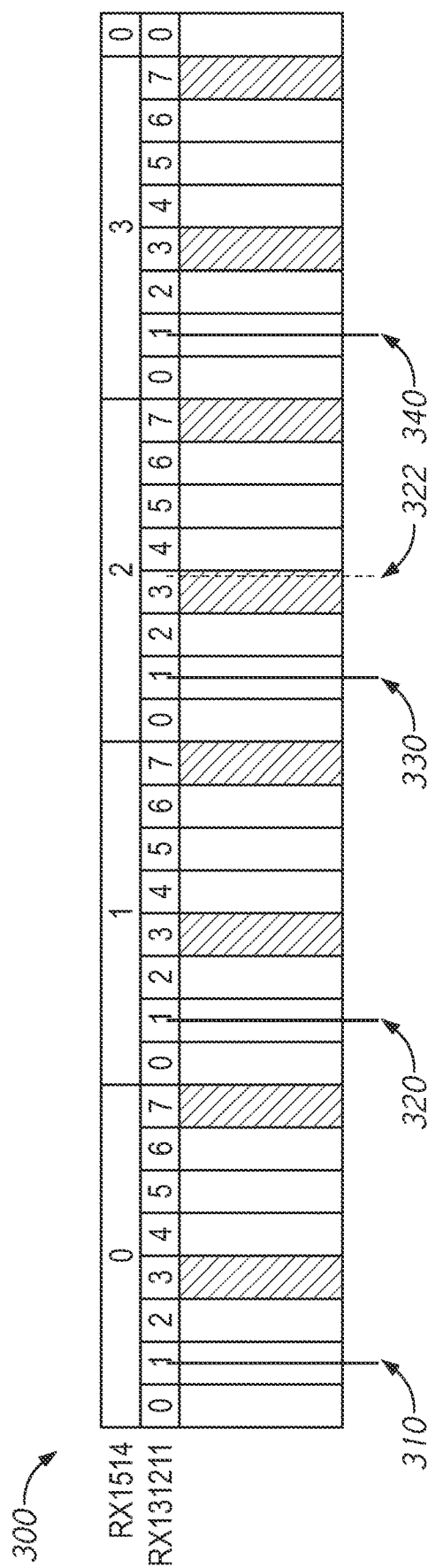
FIG. 3 depicts a layout diagram of an example memory mat for a memory bank in accordance with an embodiment of the disclosure.

The latch 232 may latch the particular RMATCH signal for a corresponding one of active low redundancy match latch signals RMLF<3:0> to indicate a match. Each of the RMLF<3:0> signals may corresponding to a particular section of a memory bank. For example, RMLF<0> signal may indicate whether an address corresponding to the RXR0<15:14> address has been replaced with a redundant address, the RMLF1<1> signal may indicate whether an address corresponding to the RXR1<15:14> has been replaced with a redundant address, etc. FIG. 3 depicts a layout diagram of an example memory mat 300 for a memory bank in accordance with an embodiment of the disclosure. If a refresh operation is to be performed on row addresses corresponding to memory cell rows 310, 320, 330, and 340, the redundancy match register 230 may determine whether any of the row addresses has been replaced with a redundant row. As shown in the memory mat 300, the row 330 has been replaced with a row 332. Accordingly, the redundancy match register 230 may store the row address corresponding to the row 330, and when the RR<15:0> combined with the RRP<8:0> address matches the row address for row 330, may cause the RMATCH signal to be set for that row, which may be latched as the RMLF<2> signal.

Based on one of the AREF or SR signals being set, the OR gate 242 may cause the row selector 240 to selectively provide the RMLF<3:0> signals as the RX1514<3:0> signals. For non-refresh access operations, the row selector 240 may provide the RXP1514<3:0> signals. The provided RX1514<3:0> signals may be decoded by the row decoder 258 to determine whether to perform or skip an access operation on a particular section of a corresponding memory bank.

The delay circuit 250, the flip-flop 252, the OR gate 254, and the AND gate 256 may be configured to delay provision of the RDEN signal based on the RDENP, the SelRA, and the SR signals, which causes the row decoder 258 to initiate decoding of the provided RX1514<3:0> signals and the RX<13:0> address to activate wordlines associated with wordline addresses WORDRX1514<3:0>, in order to allow the redundancy check on the refresh addresses through the refresh region counter circuit 220, the buffer circuit 224, the redundancy match register 230, the latch 232, and the row selector 240 to complete.

The row address control circuit 200 depicted in FIG. 2 is configured for a contemporaneous refresh of 4 rows of memory cells based on four row addresses (e.g., via the four, two-bit RHR0-3<15:14> address bits and RHR0-3<15:14> address bits). It is appreciated that the row address control circuit 200 could be modified to accommodate contemporaneous refresh of more or fewer than four rows of memory cells without departing from the scope of the disclosure. The ability of the row address control circuit 200 to detect a defective row address and prevent wordline activation of that defective row address may mitigate adverse effects caused by unpredictable behavior of an activated defective row.

Figure 4:
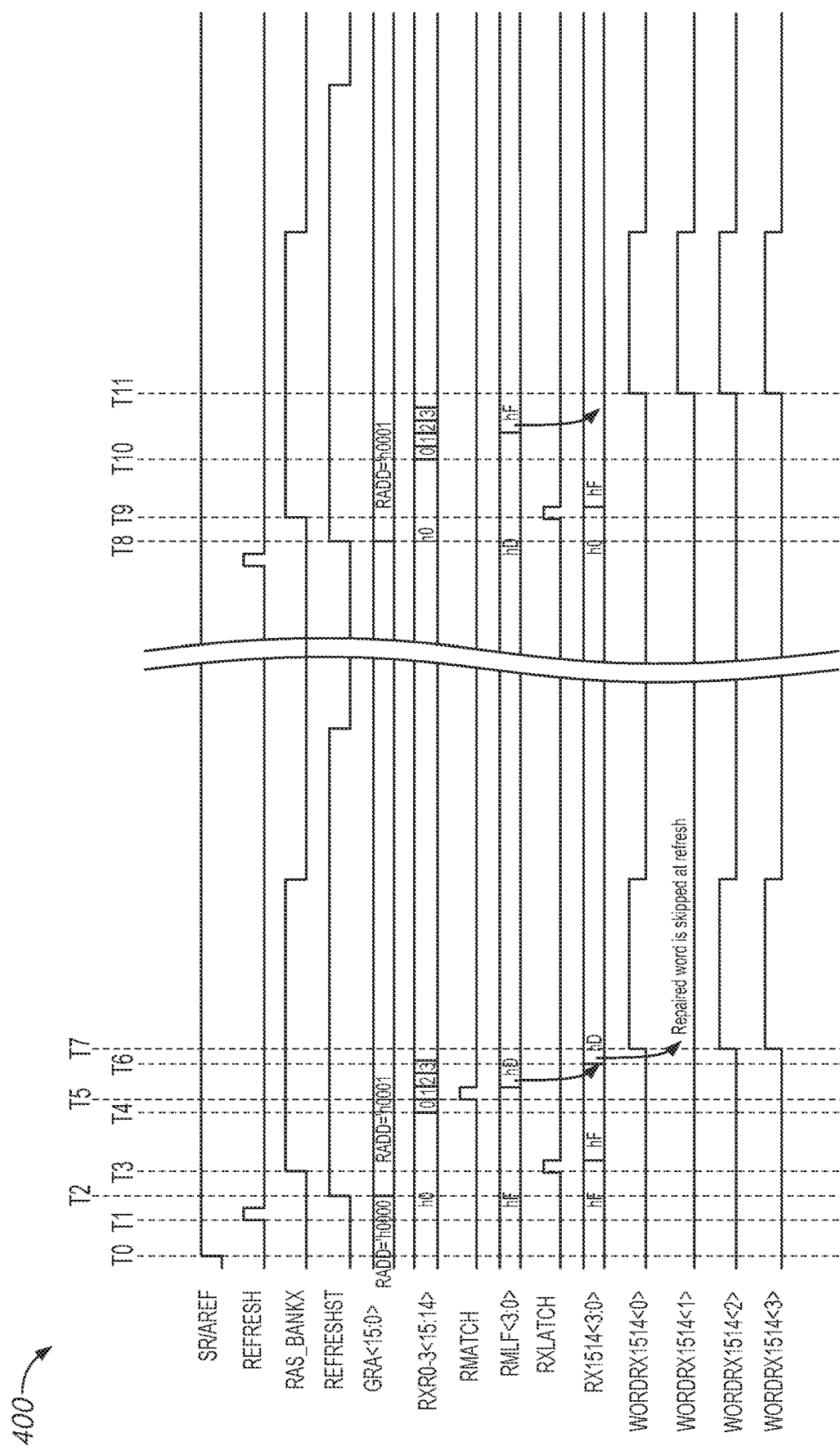
FIG. 4 is a timing diagram of a first embodiment for performing refresh operations according to an embodiment of the disclosure.

FIG. 4 is a timing diagram 400 of a first embodiment for performing refresh operations according to an embodiment of the disclosure. The refresh operations of FIG. 4 may be used to refresh memory locations of the memory array 150 of the semiconductor device 100 of FIG. 1 in some embodiments of the disclosure. In some examples, the timing diagram 400 may correspond to operation of the row address control circuit 140 of FIG. 1 and/or the row address control circuit 200 of FIG. 2.

At time T0, the SR or AREF signal may be transition to active to initiate a refresh operation. The SR or the AREF signals may be set based on a self-refresh or automatic refresh command. At time T1, a pulse may be provided on the REFRESH signal, and in response, the REFRESHST signal may transition to active at time T2. The transition of the REFRESHST signal may trigger the refresh region counter circuit 220 of FIG. 2 to start provision of the RXR0-3<15:14> addresses (e.g., b00, b01, b10, and b11), the SelRA signal, and the RMLATCH signal.

In response to the SR/AREF signals, at time T3 the bank row address strobe signal RAS_BANKX for BANKX (e.g., any of the memory banks BANK0-7 of FIG. 1) may be activated to indicate a bank on which the refresh operation is to be performed. Also at time T3, a pulse may be provided on the RXLATCH signal to cause the address latch 210 to latch the received GRA<15:0> address.

At time T4, the RXR0-3<15:14> addresses start being evaluated, and in response to detection of a hit (e.g., matched address at the redundancy match register 230), a pulse may be provided on the RMATCH signal. For example, in the timing diagram 400, a matched address is detected with the RXR1<15:14> address, and thus a pulse is provided on the RMATCH signal. The pulse on the RMATCH signal corresponding to the RXR1<15:14> address may cause the RMLF<1> bit to clear in the RMLF<3:0> signals (e.g., RMLF<3:0> transition from hF to hD). In response to the RMFL<3:0> signal transitioning to hD, at time T6, the RX1514<3:0> signals may also transition to hD via the row selector 240 and the OR gate 242 of FIG. 2.

At time T7, the row decoder 258 may activate wordlines associated with WORDRX1514<3:0> sections of the memory bank based on the RX1514<3:0> signals. The delay between times T3 and T7 may be based in part of the delay circuit 250, the flip-flop 252, and the OR gate 254, and the AND gate 256 of FIG. 2. Thus, as shown in the timing diagram 400, the wordlines in WORDRX1514<3, 2, and 0> sections of the memory bank may be activated, while the no wordline in the WORDRX1514<1> section is activated. Between times T7 and T8, the RAS_BANKX and WORDRX1514<3:0> signals may clear to terminate the refresh operation.

Time T8-T11 depict a subsequent refresh operation where no repaired rows are detected, and as such, at time T11, each of the WORDRX1514<3:0> wordlines are activated for the refresh operation. After time T11, the RAS_BANKX and WORDRX1514<3:0> signals may clear to terminate the subsequent refresh operation.

Figure 5:
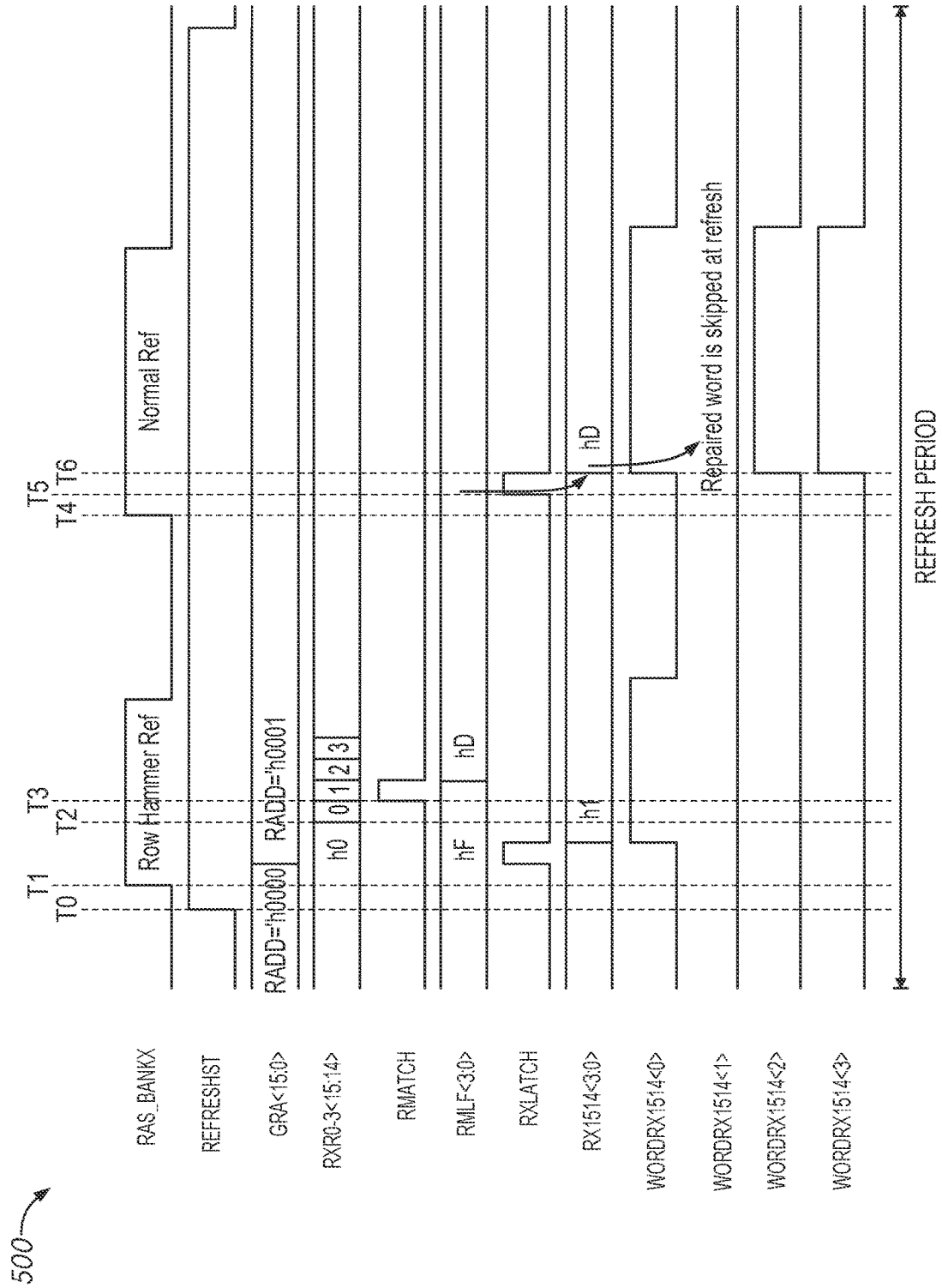
FIG. 5 is a timing diagram of a second embodiment for performing refresh operations according to an embodiment of the disclosure.

FIG. 5 is a timing diagram 500 of a second embodiment for performing refresh operations according to an embodiment of the disclosure. The refresh operations of FIG. 5 may be used to refresh memory locations of the memory array 150 of the semiconductor device 100 of FIG. 1 in some embodiments of the disclosure. In some examples, the timing diagram 500 may correspond to operation of the row address control circuit 140 of FIG. 1 and/or the row address control circuit 200 of FIG. 2. The timing diagram 500 depicts a double pump refresh operation, whereby the refresh operation includes a RHR followed by a normal refresh. The RHR starts at time T1 and the normal refresh starts at time T4.

At time T0, the REFRESHST signal may transition to active at time T2. The transition of the REFRESH signal may trigger the refresh region counter circuit 220 of FIG. 2 to start provision of the RXR0-3<15:14> addresses, the SelRA signal, and the RMLATCH signal. At time T1, the RHR may start.

At time T2, the RXR0-3<15:14> addresses (e.g., b00, b01, b10, and b11) start being evaluated, and in response to detection of a hit (e.g., matched address at the redundancy match register 230), a pulse may be provided on the RMATCH signal. For example, in the timing diagram 500, a matched address is detected with the RXR1<15:14> address, and thus a pulse is provided on the RMATCH signal at time T3. The pulse on the RMATCH signal corresponding to the RXR1<15:14> address may cause the RMLF<1> bit to clear in the RMLF<3:0> signals (e.g., RMLF<3:0> transition from hF to hD). However, because neither the AREF nor the SR signals would be set during the RHR, the row selector 240 may provide the RXP1514<3:0> signal as the RX1514<3:0> to trigger a targeted refresh.

At time T4, the normal refresh may start, with the GRA<15:0> signal latched at time in response to a pulse on the RXLATCH signal at time T5. Accordingly, the RX1514<3:0> signals may transition from the RXR1514<3:0> signals (e.g., hI) to the RMLF<3:0> signals (e.g., hD). At time T6, the row decoder 258 may activate wordlines associated with WORDRX1514<3:0> sections of the memory bank based on the RX1514<3:0> signals. Thus, as shown in the timing diagram 500, the wordlines in WORDRX1514<3, 2, and 0> sections of the memory bank may be activated, while the no wordline in the WORDRX1514<1> section is activated. Time T8-T11 depict a subsequent refresh operation where no repaired rows are detected, and as such, at time T11, each of the WORDRX1514<3:0> wordlines are activated for the refresh operation.

Applicant notes that the relative timing between signals, the pulse lengths, etc., in the timing diagrams 400 and 500 of FIGS. 4 and 5, respectively, are exemplary, and may actual relative timing may vary what is depicted without departing from the scope of the disclosure.

Figure 6:
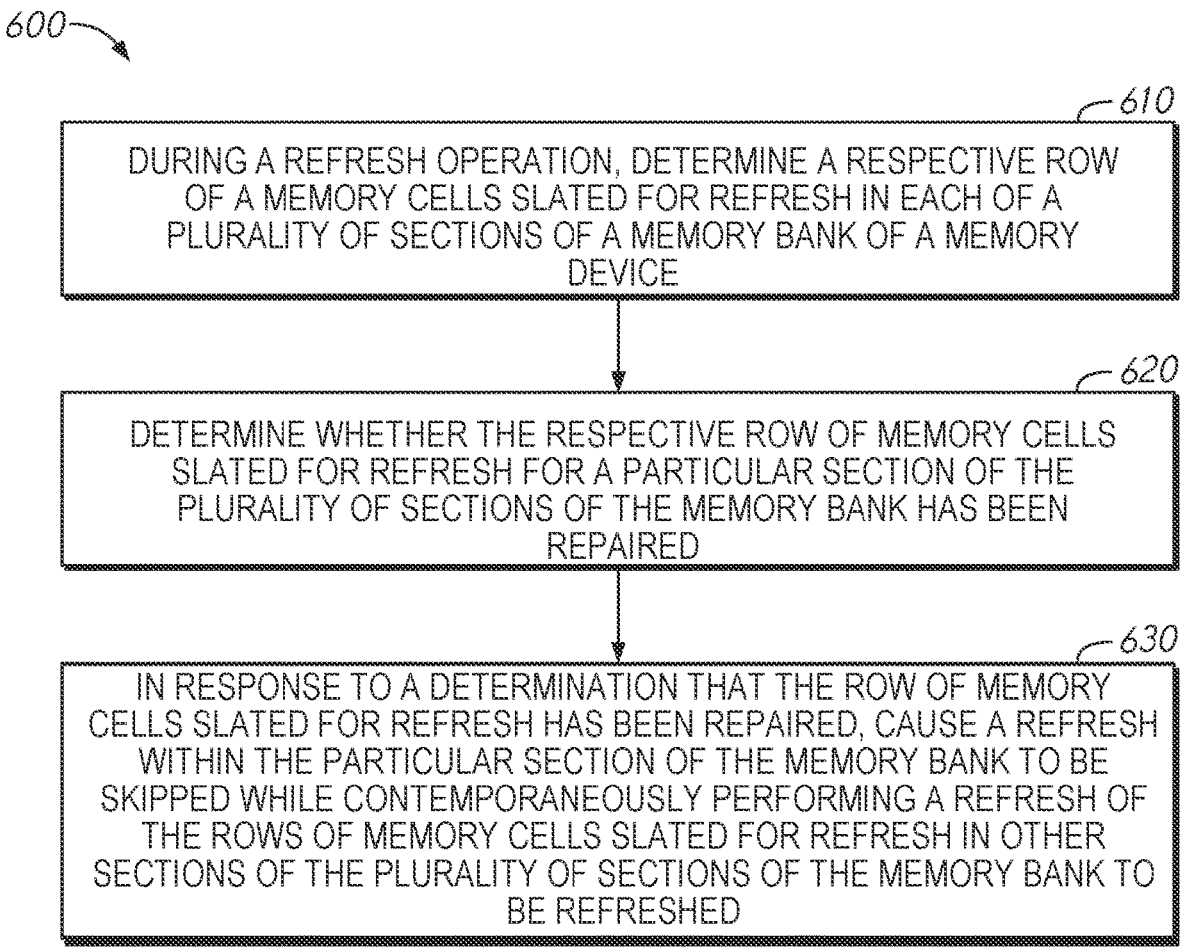
FIG. 6 depicts a flowchart of an exemplary method for performing a refresh operation according to an embodiment of the disclosure.

FIG. 6 depicts a flowchart of an exemplary method 600 for performing a refresh operation according to an embodiment of the disclosure. The method 600 may be performed by the refresh address control circuit 140 of FIG. 1 and/or the refresh address control circuit 200 of FIG. 2.

The method 600 may be performed during a refresh operation. The method 600 may include determining a respective row of a memory cells slated for refresh in each of a plurality of sections of a memory bank of a memory device, at 610. The determination may be made via the refresh region counter circuit 220, the address latch 210, and the pre-decoder 212 of FIG. 2. In some examples, the method 600 may further include latching a global row address (e.g., via the address latch 210 of FIG. 2). The respective row of memory cells slated for refresh in each of the plurality of sections may be based on the global row address. In some examples, the method 600 may further include decoding the global row address to provide a pre-decoded row address (e.g., via the pre-decoder 212 of FIG. 2). The respective row of memory cells slated for refresh in each of the plurality of sections may be based on the pre-decoded row address.

The method 600 may further include determining whether the respective row of memory cells slated for refresh for a particular section of the plurality of sections of the memory bank has been repaired, at 620. In some examples, the method 600 may further include comparing an address associated with the respective row of memory cells slated for refresh with addresses corresponding to repaired rows stored in a register. The determination and comparison may be made via the redundancy match register 230 of FIG. 2.

The method 600 may further include in response to a determination that the row of memory cells slated for refresh has been repaired, causing a refresh within the particular section of the memory bank to be skipped while contemporaneously performing a refresh of the rows of memory cells slated for refresh in other sections of the plurality of sections of the memory bank to be refreshed, at 630. The activation may be skipped based on signals provided from the row selector 240 to the row decoder 258 of FIG. 2. In some examples, the method 600 may further include delaying activation of wordlines in the plurality of sections until after the determination as to whether the respective row of memory cells slated for refresh in the particular section of the plurality of sections has been repaired. In some examples, delaying activation of the wordlines in the plurality of sections until after the determination as to whether the respective row of memory cells slated for refresh in the particular section of the plurality of sections has been repaired via delay circuit e.g., the delay circuit 250, the flip-flop 252, the OR gate 254, and the AND gate 256 of FIG. 2). In some examples, the method 600 may further include decoding the row addresses corresponding to the respective rows of memory cells slated for refresh in each of the plurality of sections detected to be operational via a row decoder.

In some examples, the refresh operation includes a row hammer refresh followed by a normal refresh. In some examples, the method 600 may further include determining whether the respective row of memory cells slated for refresh the particular section of the plurality of sections has been repaired occurs during the row hammer refresh portion of the refresh operation From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a memory bank having a plurality of sections;
a row address control circuit configured to, during a refresh operation at the memory bank where the refresh operation includes a row hammer refresh followed by a normal refresh, determine during the row hammer refresh whether a respective row of memory cells slated for refresh in each of the plurality of sections has been repaired, and in response to a determination that the respective row of memory cells in a particular section of the plurality of sections has been repaired, causing the memory bank to skip a refresh in the particular section while contemporaneously performing a refresh during the normal refresh in the respective rows of sections of the plurality of sections detected as being operational.

2. The apparatus of claim 1, wherein the row address control circuit includes a register configured to compare the respective rows of memory cells slated for refresh with rows of memory cells that have been repaired to determine whether any of the respective rows of memory cells slated for refresh have been repaired.

3. The apparatus of claim 1, wherein the row address control circuit further includes a delay circuit to delay activation of wordlines in the plurality of sections until after the determination as to whether the respective row of memory cells slated for refresh in each of the plurality of sections has been repaired.

4. The apparatus of claim 3, wherein the delay circuit includes a flip-flop configured to delay a row decoder enable signal responsive to control signal set based on initiation of the refresh operation.

5. The apparatus of claim 1, wherein the row address control circuit further comprises a row decoder configured to decode the row addresses corresponding to the respective rows of memory cells slated for refresh in each of the plurality of sections detected to be operational.

6. The apparatus of claim 1, wherein the row address control circuit further comprises an address latch configured to latch a global row address, wherein the respective row of memory cells slated for refresh in each of the plurality of sections is based on the global row address.

7. The apparatus of claim 6, wherein the row address control circuit further comprises a pre-decoder circuit configured to determine a pre-decoded row address from the global row address, wherein the respective row of memory cells slated for refresh in each of the plurality of sections is based on the pre-decoded row address.

8. An apparatus, comprising:
a row decoder configured to decode row addresses corresponding to a plurality of rows of memory cells of a memory bank slated for contemporaneous refresh during a refresh operation based on a row match signal, the refresh operation including a row hammer refresh followed by a normal refresh;
a register circuit configured to store repair row addresses corresponding to rows of memory cells that have been repaired, wherein the register circuit is configured to compare during the row hammer refresh row addresses corresponding to the plurality of rows of memory cells of the memory bank slated for contemporaneous refresh with the repair row addresses and to provide a match signal when a match is detected;
a latch circuit configured to latch a bit of the row match signal in response to the match signal being set, wherein the bit of the row match signal corresponds to a row of memory cells of the plurality of rows of memory cells slated for contemporaneous refresh during the normal refresh that has been repaired, wherein the row decoder is configured to skip decoding of a row of memory cells of the plurality of rows of memory cells of the memory bank slated for contemporaneous refresh during the normal refresh in response to the latched bit of the row match signal.

9. The apparatus of claim 8, further comprising a delay circuit configured to delay the row decoder from being enabled until after the register circuit has compared the row addresses corresponding to the plurality of rows of memory cells of the memory bank slated for contemporaneous refresh with the repair row addresses.

10. The apparatus of claim 9 wherein the delay circuit includes a flip-flop configured to delay provision of an enable signal to the row decoder.

11. The apparatus of claim 8, further comprising a memory array comprising a plurality of memory banks, including the memory bank.

12. A method, comprising:
during a refresh operation including a row hammer refresh followed by a normal refresh:
determining a respective row of a memory cells slated for refresh in each of a plurality of sections of a memory bank of a memory device;
determining whether the respective row of memory cells slated for refresh for a particular section of the plurality of sections of the memory bank has been repaired during the row hammer refresh; and in response to a determination that the row of memory cells slated for refresh has been repaired, causing a refresh within the particular section of the memory bank to be skipped while contemporaneously performing a refresh during the normal refresh of the rows of memory cells slated for refresh in other sections of the plurality of sections of the memory bank to be refreshed.

13. The method of claim 12, further comprising comparing an address associated with the respective row of memory cells slated for refresh with addresses corresponding to repaired rows stored in a register.

14. The method of claim 12, further comprising delaying activation of wordlines in the plurality of sections until after the determination as to whether the respective row of memory cells slated for refresh in the particular section of the plurality of sections has been repaired.

15. The method of claim 14, further comprising delaying activation of the wordlines in the plurality of sections until after the determination as to whether the respective row of memory cells slated for refresh in the particular section of the plurality of sections has been repaired via a flip-flop.

16. The method of claim 12, further comprising decoding the row addresses corresponding to the respective rows of memory cells slated for refresh in each of the plurality of sections detected to be operational via a row decoder.

17. The method of claim 12, further comprising latching a global row address, wherein the respective row of memory cells slated for refresh in each of the plurality of sections is based on the global row address.

18. The method of claim 17, further comprising decoding the global row address to provide a pre-decoded row address, wherein the respective row of memory cells slated for refresh in each of the plurality of sections is based on the pre-decoded row address.

* * * * *